United States Patent [19]
Dunn

[11] 3,942,164
[45] Mar. 2, 1976

[54] SENSE LINE COUPLING REDUCTION SYSTEM

[75] Inventor: William C. Dunn, Scottsdale, Ariz.

[73] Assignee: Semi, Inc., Phoenix, Ariz.

[22] Filed: Jan. 30, 1975

[21] Appl. No.: 545,737

[52] U.S. Cl................................ 340/173 R; 307/238
[51] Int. Cl.² ................... G11C 11/40; G11C 13/00
[58] Field of Search................... 340/173 R; 307/238

[56] References Cited
UNITED STATES PATENTS
3,365,707  1/1968  Mayhew.......................... 340/173 R Primary Examiner—Terrell W. Fears
Attorney, Agent, or Firm—Lindenberg, Freilich, Wasserman, Rosen & Fernandez

[57] ABSTRACT

The inductive and capacitive coupling between adjacent sense lines in a semi-conductor memory is minimized by periodically interchanging the locations of the two sense lines assigned to each column of storage cells in a semi-conductor memory.

4 Claims, 2 Drawing Figures

SENSE LINE COUPLING REDUCTION SYSTEM

BACKGROUND OF THE INVENTION

This invention relates to semi-conductor memories and more particularily to improvements therein.

In the layout of a semi-conductor memory, usually the memory cells are laid out in an array of columns and rows. There are usually two sense lines for each cell and a pair of sense lines is connected to a column of cells. As a result, in the memory array, the pairs of sense lines are adjacent and parallel to one another. In the operation of the memory, usually, one of the sense lines will remain at its initial voltage, usually a high voltage, and the other sense line of each pair will change states, usually going from a high to a low voltage.

As a result of the foregoing, coupling occurs between these sense lines which has the effect of causing transients to appear, as the result of which, the operation of any sensing circuits used to obtain a differential signal from the sense line has to slow down, in order to avoid an erroneous reading. This of course slows the cycle time for a memory and thereby slows the entire equipment which uses the memory.

SUMMARY OF THE INVENTION

It is an object of this invention to provide an arrangement for the sense lines of a semi-conductor memory which minimizes the effect of coupling therebetween.

Yet another object of this invention is the provision of an arrangement for the sense lines of a semiconductor memory whereby the memory operation is speeded up.

Still another object of the present invention is the provision of an improved semi-conductor memory sense line arrangement.

The novel features of the invention are set forth with particularity in the appended claims. The invention will best be understood from the following description when read in conjunction with the accompanying drawings.

BRIEF DESCRIPTION OF THE INVENTION

DESCRIPTION OF THE PREFERRED EMBODIMENT

Figure 1:
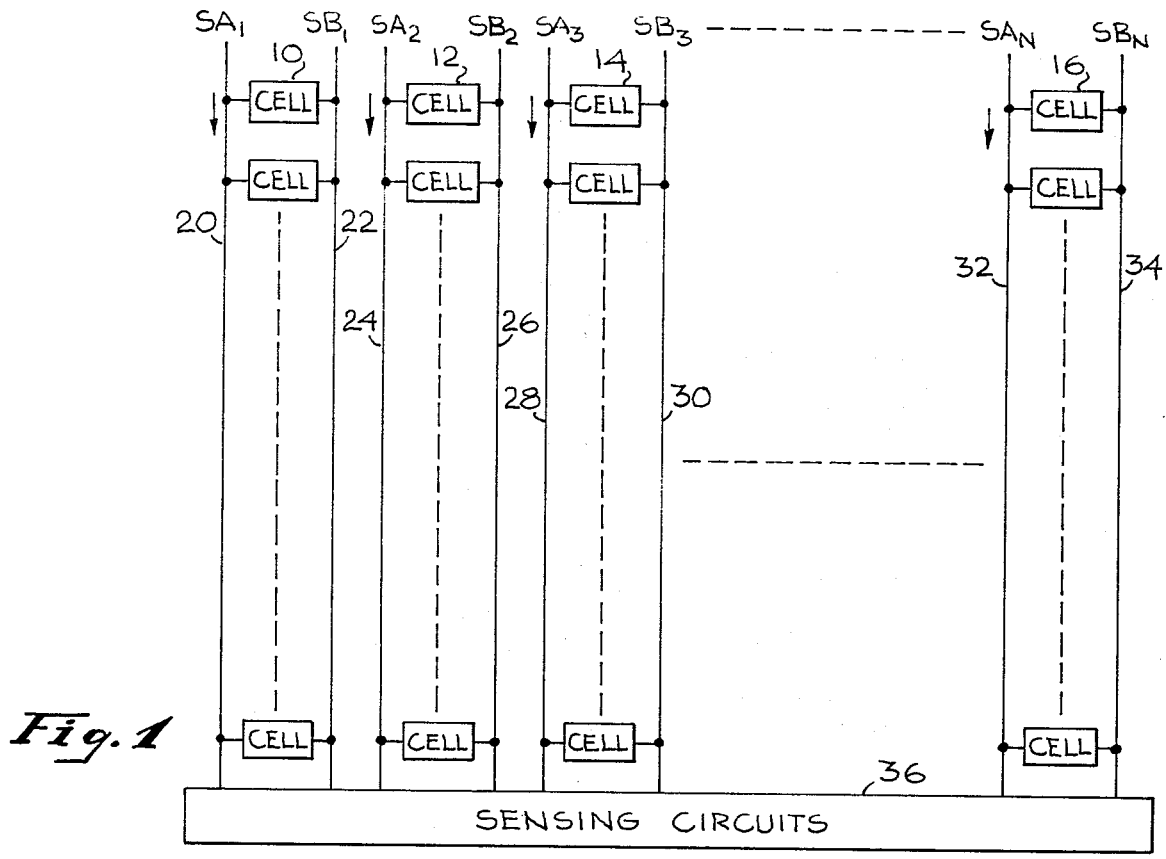
FIG. 1 is a schematic drawing of a semi-conductor memory layout as it presently exists.

FIG. 1 schematically represents an array of storage cells as they are presently disposed on a semi-conductor memory chip. In the interests of simplicity in the drawings, only the array of memory cells and their sense lines are shown. The remainder of the memory circuitry is not shown. It is well known, and its addition would not add to an understanding of this invention.

The memory basically comprises an array of memory cells 10, 12, 14, 16, for example, which usually are binary circuits, such as flip-flops. Each cell is associated with a pair of sense lines, 20, 22, 24, 26, 28, 30, 32, 34, for example. There is one pair of sense lines for each column of cells. These sense lines connect to sensing circuits 36, which usually comprise circuits for obtaining a differential signal from each pair of sense lines to determine whether or not the data in the cell, from which a read out occurs is a one or a zero.

Usually, in reading the data out of a semi-conductor memory, the read-out occurs from all of the cells in a single row to provide the binary digits representative of a word which has been stored. Thus, assume that cells 10, 12, 14, 16 have been driven to provide signals on the associated pairs of sense lines which represent data stored in these cells. In response to the read-out signals applied to the cells, assume a worst case, namely that sense line 20 goes from a high to a low voltage, sense line 22 remains at a high voltage, sense line 24 goes from a high to a low voltage, sense line 26 remains at a high voltage, sense line 28 remains at a high voltage, and sense line 30 goes from a high to a low voltage. Sense line 32 goes from a high to a low voltage and sense line 34 remains at a high voltage.

As a result of electrical coupling which occurs between sense lines 22 and 24, a transient read-out signal occurs on sense line 24, due to capacitive loading which occurs between sense lines 22 and 24. Also, as a result of the coupling a transient appears on sense line 22. This slows down the operation of any sensing circuits 36 which may be used to obtain a differential signal from the first pair of sense lines.

The type of reaction just described does not occur to any noticeable degree between sense lines 24, 26, 28 and 30, since the two adjacent sense lines, 26 and 28 both remain high.

It should be appreciated that slowing down of the transient read-out signal on a sense line, together with an appearance of an induced transient on an adjacent sense line, requires the provision of a longer interval of time for operation of the sensing circuits to enable them to accurately detect the information being read out of the memory. When the read-out interval requires a longer time, then the entire operation of the memory is also slowed down.

Figure 2:
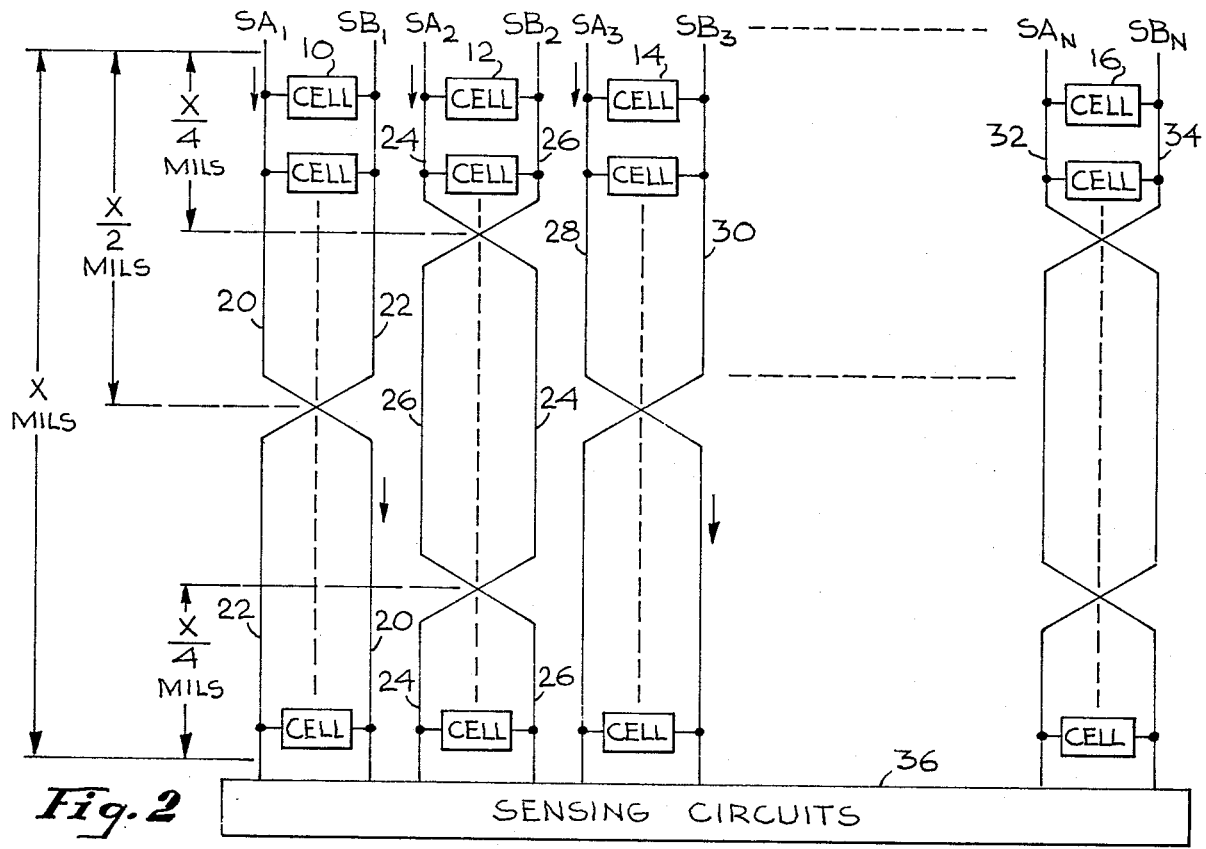
FIG. 2 is a block schematic drawing of a semi-conductor memory layout showing the disposition of the sense lines in accordance with this invention.

FIG. 2 shows an arrangement of the sense lines of the memory in accordance with this invention. The same reference numerals will be applied to the same structures as are used in FIG. 1.

In accordance with this invention, the sense line 20, and the sense line 22 have their respective locations interchanged on the memory chip at the mid-point of their length. Sense lines 24 and 26 have their location interchanged one quarter way from each end. Sense lines 28 and 30 have their locations interchanged at their midpoint.

The indicated sense line pattern interchange is carried out throughout the memory. That is, alternate pairs of sense lines have their locations interchanged at their midpoint and the remaining alternate pairs of sense lines have their locations interchanged one quarter of their length inward from each end.

Assuming the same read-out pattern as was assumed with the connection of the description of FIG. 1, with the sense lines 20 and 24 having a voltage going from a high level to a low level, and sense lines 22 and 26 remaining high, then the coupling sense lines 22 and 24 will exist along only 25% of the sense line so that the capcitive loading is reduced to 25% of the loading amount which occurred when the sense line configuration shown in FIG. 1 is used. However, coupling also exists for 25% of the sense line length between sense lines 20 and 24, but since the voltage on both of these lines are moving together from a high to a low level, the effective loading is zero. If the reasoning applied for the effective loading between the first and second pair of sense lines is carried through for the effective loading for the second and third pairs of sense lines and so on throughout the memory, it will become clear that by the transposition of the sense line as shown the effective loading caused by the electrical coupling between the sense lines is reduced by at least half, the induced transients are also reduced by half, enabling the sensing circuits to operates more quickly, in view of these transient reductions.

Accordingly, there has been described and shown here and above, a novel and useful arrangement for the placement of the sensing lines of a semi-conductor memory, whereby coupling between the sensing lines is reduced, enabling more accurate sensing of the signals which are applied to the sense line and a faster operation of the memory system.

The embodiments of the invention in which an exclusive property or privilege is claimed are defined as follows:

1. In a semi-conductor memory wherein the storage elements of said memory are arranged in an array of rows and columns and there is provided a parallel pair of sense lines for each column of memory elements, to which all the elements of a column are connected, the improvement comprising, transposing the locations of the sense lines in each pair of sense lines which are alternate pairs of sense lines in said array at a first predetermined distance from one end along the length of said alternate pairs of sense lines, and interchanging the locations of each pair of sense lines in the remaining pairs of sense lines at a second predetermined distance from one end of each said pair of remaining pairs of sense lines.

2. In a memory system as recited in claim 1 wherein the first predetermined distance is a distance located at one half of the length of a sense lines pair, and said second predetermined distance is the distance equal to one forth of the length of a sense line.

3. In a semi-conductor memory of the type wherein a plurality of storage cells of the binary storage type are disposed in an array of columns and rows over the over the surface of a chip, and there is provided a pair of sense lines for each column of storage cells to which all of the storage cells in a column are connected, said sense lines in each column extending parallel to one another on said chip, the method of reducing coupling effects comprising, interchanging the locations of the sense lines associated with alternate columns of memory cells at a first predetermined location along the length thereof, and interchanging the location of the sense lines in each pair of sense lines in the remaining alternate columns at a second predetermined location for reducing the electrical coupling between sense lines in adjacent columns.

4. A method as recited in claim 3 wherein said first predetermined distance is the length of one half of said sense line, and said second predetermined distance is a length which is one quarter of the length of said sense lines from one end.

* * * * *